United States Patent
Mitsuyoshi et al.

(10) Patent No.: US 9,570,333 B2
(45) Date of Patent: Feb. 14, 2017

(54) SUBSTRATE TREATING APPARATUS

(75) Inventors: Ichiro Mitsuyoshi, Kyoto (JP); Hideki Shibata, Kyoto (JP); Tomoyasu Furuta, Kyoto (JP)

(73) Assignee: SCREEN Holdings Co., Ltd. (JP)

( * ) Notice: Subject to any disclaimer, the term of this patent is extended or adjusted under 35 U.S.C. 154(b) by 289 days.

(21) Appl. No.: 13/368,986

(22) Filed: Feb. 8, 2012

(65) Prior Publication Data

US 2012/0237320 A1 Sep. 20, 2012

(30) Foreign Application Priority Data

Mar. 18, 2011 (JP) ................................ 2011-061157

(51) Int. Cl.
*H01L 21/677* (2006.01)

(52) U.S. Cl.
CPC .............. *H01L 21/67769* (2013.01)

(58) Field of Classification Search
CPC .................... H01L 21/67775; H01L 21/67772; H01L 21/677769; B65G 1/0407; B65G 1/0435
USPC .................................................. 414/277, 940
See application file for complete search history.

(56) References Cited

U.S. PATENT DOCUMENTS

| 6,579,052 B1 | 6/2003 | Bonora et al. ............ 414/222.01 |
| 6,832,863 B2* | 12/2004 | Sugimoto et al. ............ 396/611 |
| 2006/0137726 A1* | 6/2006 | Sano ..................... G03F 7/7075 134/61 |
| 2006/0182560 A1 | 8/2006 | Mitsuyoshi |
| 2009/0238664 A1* | 9/2009 | Murata et al. ........... 414/222.02 |
| 2010/0212585 A1* | 8/2010 | Tsukinoki ...................... 118/500 |
| 2010/0215461 A1 | 8/2010 | Kamikawa et al. |
| 2010/0228378 A1* | 9/2010 | Fukutomi ......... H01L 21/67766 700/112 |
| 2012/0093620 A1* | 4/2012 | Murata et al. ................ 414/281 |

(Continued)

FOREIGN PATENT DOCUMENTS

| JP | 3521330 | 2/2004 |
| JP | 2006-237559 | 9/2006 |

(Continued)

OTHER PUBLICATIONS

Corresponding Korean Patent Application No. 10-2011-0102929 Office Action date May 5, 2013.

(Continued)

*Primary Examiner* — Kaitlin Joerger
(74) *Attorney, Agent, or Firm* — Ostrolenk Faber LLP (57) ABSTRACT

A substrate treating apparatus includes a pod storage unit 9 between a substrate treating unit 11 and a pod storage and transport unit 7, with a transport robot 19 transporting FOUPs 3 between a load port 5 and a rack array 33. A transport robot 31 transports the FOUPs 3 between the rack array 33, a rack array 69 and a receiver 27. The transportation between the load port 5 and rack array 33 and the transportation between the rack array 69, rack array 33 and receiver 27 can be carried out substantially in parallel. As a result, the efficiency of transporting the FOUPs 3 can be improved to improve throughput. Moreover, an increase in apparatus size can be inhibited since only the pod storage unit 9 is disposed between the pod storage and transport unit 7 and substrate treating unit 11. The capacity for storing the FOUPs 3 can be increased to make effective use of the high throughput of the apparatus.

18 Claims, 4 Drawing Sheets

(56) References Cited

U.S. PATENT DOCUMENTS

2012/0237320 A1* 9/2012 Mitsuyoshi et al. ..... 414/222.01

FOREIGN PATENT DOCUMENTS

| JP | 2010-192855 | 9/2010 |
| KR | 10-0220817 | 6/1999 |
| KR | 10-2010-0008569 | 1/2010 |
| TW | 201016565 A1 | 5/2010 |

OTHER PUBLICATIONS

Office Action dated Oct. 28, 2013 for corresponding Taiwan Patent Application No. 100138218 (6 pages).
Notice of Allowance dated Nov. 20, 2013 for corresponding Korean Patent Application No. 10-2011-0102929 (2 pages).

* cited by examiner

SUBSTRATE TREATING APPARATUS

BACKGROUND OF THE INVENTION (1) Field of the Invention

This invention relates to a substrate treating apparatus for treating semiconductor wafers, substrates for liquid crystal displays, substrates for plasma displays, substrates for organic EL devices, substrates for FEDs (Field Emission Displays), substrates for optical displays, substrates for magnetic disks, substrates for magnetic optical disks, substrates for photomasks or substrates for solar cells (hereinafter called simply substrates). The apparatus takes in the substrates along with pods thereof, takes the substrates out of the pods, carries out various types of treatment such as cleaning treatment and etching treatment for the substrates, and puts the substrates back into the pods for delivery.

(2) Description of the Related Art

Conventionally, a first apparatus of this type includes a substrate treating unit, a pod storage and transport unit and a load port. The pod storage and transport unit has a plurality of racks, an internal receiver, a first transport device and a second transport device (see Japanese Unexamined Patent Publication No. 2006-237559, for example).

The substrate treating unit carries out various types of treatment for substrates. The pod storage and transport unit is juxtaposed to the substrate treating unit for storing and transporting FOUPs (Front Opening Unified Pods) containing the substrates. The load port is juxtaposed to the pod storage and transport unit for receiving the FOUPs. The FOUPS are transferred to and from the load port by automatic guided vehicles (AGV), which constitute an automated material handling system, or an overhead hoist transfer. The plurality of (e.g. 16) racks in the pod storage and transport unit are provided for storing the FOUPs. The internal receiver is disposed between the pod storage and transport unit and the plurality of racks for receiving the FOUPs. The first transport device transports the FOUPs between the load port and racks. The second transport device transports the FOUPs between the racks and internal receiver.

In the first apparatus constructed as described above, the first transport device transports the FOUPs between the load port and the racks, and the second transport device transports the FOUPs between the internal receiver and racks. Therefore, these transport operations can be carried out substantially in parallel. This improves the efficiency of transporting the FOUPs to improve the throughput of the substrate treating apparatus.

Generally, the automated material handling system is not stable due to variations in transporting time. This impedes improvement in the throughput of the substrate treating apparatus. Then, a second apparatus has been proposed, which includes an increased number of load ports in order to absorb the variations (see Japanese Patent No. 3521330, for example). A third apparatus proposed has overhead hoist transfers in two lanes (see Japanese Unexamined Patent Publication No. 2010-192855, for example).

However, the conventional examples with such constructions have the following problems.

Since, generally, the substrate treating unit carries out treatment based on chemical reactions, and it is impossible to shorten treating time in the substrate treating unit. Therefore, in order to improve throughput, the number of treating tanks arranged in the substrate treating unit has to be increased to increase the number of treatments carried out in parallel. This will increase the number of empty FOUPs having contained substrates under treatment now, which will increase also repositories for the FOUPs. The first conventional apparatus has to be increased in width or height in order to increase the number of racks while allowing access thereto by both the first transport device and second transport device. However, an increased width of the apparatus will result in a reduced number of apparatus that can be arranged in a clean room. An increased height of the apparatus will impose restrictions on arrangement in connection with the ceiling height of the clean room. Thus, there is a problem that performance of high throughput cannot be maximized.

The second apparatus, with the increased load ports, has an enlarged frontage which is a disadvantage in the number of apparatus that can be arranged in a clean room.

The third apparatus has a disadvantage in terms of cost since the overhead hoist transfer vehicles are expensive. Further, the two lanes require an increased width between the load ports and an increased length of the apparatus. Thus, the third apparatus also has a disadvantage in the number of apparatus installed.

SUMMARY OF THE INVENTION

This invention has been made having regard to the state of the art noted above, and its object is to provide a substrate treating apparatus which can store an increased number of pods to realize high throughput of the apparatus while inhibiting an increase in apparatus size.

The above object is fulfilled, according to this invention, by a substrate treating apparatus comprising a substrate treating unit for treating substrates; a pod storage unit juxtaposed to the substrate treating unit for storing pods which contain the substrates; a pod storage and transport unit juxtaposed to the pod storage unit for storing and transporting the pods which contain the substrates; and a first receiver juxtaposed to the pod storage and transport unit for receiving the pods; wherein the pod storage unit includes a plurality of first racks for holding the pods; and the pod storage and transport unit includes a plurality of second racks for holding the pods; a second receiver disposed between the substrate treating unit and the second racks for receiving the pods; a first transport device for transporting the pods between the first receiver and the second racks; and a second transport device for transporting the pods between the first racks, the second racks and the second receiver.

According to this invention, the pod storage unit is disposed between the substrate treating unit and pod storage and transport unit, with the first transport device transporting the pods between the first receiver and second racks. The second transport device transports the pods between the first racks, second racks and second receiver. Therefore, the transportation between the first receiver and second racks and the transportation between the first racks, second racks and second receiver can be carried out substantially in parallel. As a result, the efficiency of transporting the pods can be improved to improve throughput. Moreover, an increase in apparatus size can be inhibited since only the pod storage unit is disposed between the pod storage and transport unit and substrate treating unit. Therefore, the capacity for storing the pods can be increased to make effective use of the high throughput of the apparatus.

In this invention, the apparatus may further comprise a controller for controlling transportation by the first transport device and the second transport device; wherein the controller is arranged to control transportation of the pods to secure at least one vacancy among the second racks.

Since the controller controls transportation to secure at least one vacancy among the second racks, the vacancy in the second racks can be used to deliver the pods with priority from the first racks to the first receiver.

In this invention, the apparatus may further comprise a controller for controlling transportation by the first transport device and the second transport device; wherein the controller is arranged to control transportation of the pods to secure at least one vacancy among the first racks.

Since the controller controls transportation to secure at least one vacancy among the first racks, even when the second racks are full up, the vacancy can be used temporarily to accommodate a pod containing treated substrates. This can prevent stagnation in unloading treated substrates from the substrate treating unit.

In this invention, the apparatus may further comprise a controller for controlling transportation by the first transport device and the second transport device; wherein the pod storage and transport unit includes a provisional receiving rack for allowing transportation of the pods only in one way from the first transport device to the second transport device; and the controller is arranged to make priority use of the provisional receiving rack for delivery of the pods.

The pods can be delivered with priority from the first racks to the first receiver by way of the provisional receiving rack.

In this invention, the first racks may hold, with priority, the pods having contained the substrates under treatment by the substrate treating unit.

Since empty pods are stored with priority in positions close to the second receiver, treated substrates can be placed in the pods in a short time.

In this invention, the second racks may hold, with priority, the pods containing the substrates before being loaded into the substrate treating unit, and the pods containing the substrates having been treated by the substrate treating unit.

Since the pods containing the treated substrates are stored with priority in positions close to the first receiver, the pods containing the treated substrates can be transported to the first receiver in a short time.

In this invention, the controller may require an automated material handling system, which transfers the pods to and from the first receiver, to transport more pods than the number of pods that can be placed on the first receiver when there is a vacancy in the first racks or the second racks.

Since the pod storage unit allows an increased number of pods to be stored, multiplex transportation of the pods can be carried out by the automated material handling system by requiring transportation of more pods than the number of pods that can be placed on the first receiver. Thus, long transporting intervals may be set to the automated material handling system which transfers the pods to and from the first receiver. This can lighten the load on the automated material handling system.

BRIEF DESCRIPTION OF THE DRAWINGS

For the purpose of illustrating the invention, there are shown in the drawings several forms which are presently preferred, it being understood, however, that the invention is not limited to the precise arrangement and instrumentalities shown.

DESCRIPTION OF THE PREFERRED EMBODIMENTS

An embodiment of this invention will be described hereinafter with reference to the drawings.

Figure 1:
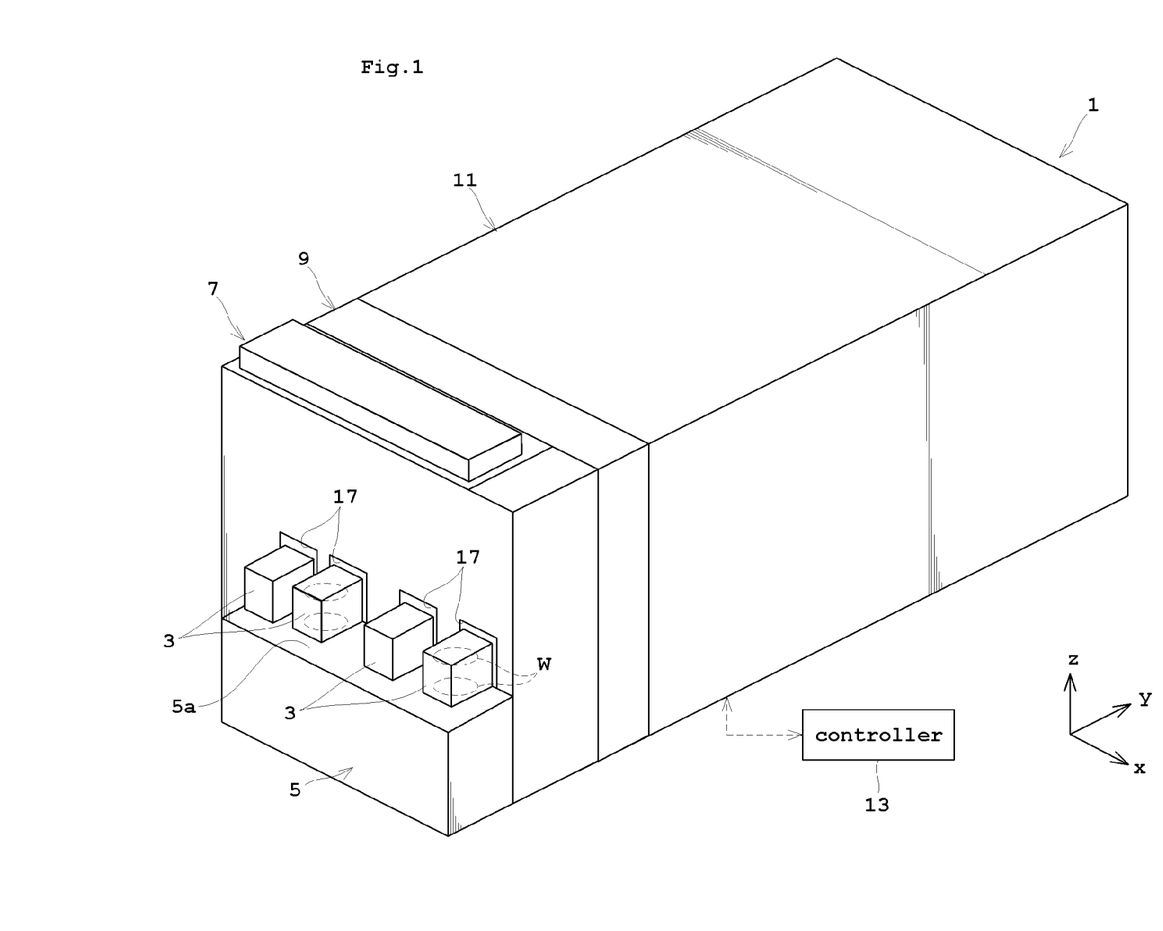
FIG. 1 is a perspective view showing an outward appearance of a substrate treating apparatus according to this invention.
Figure 2:
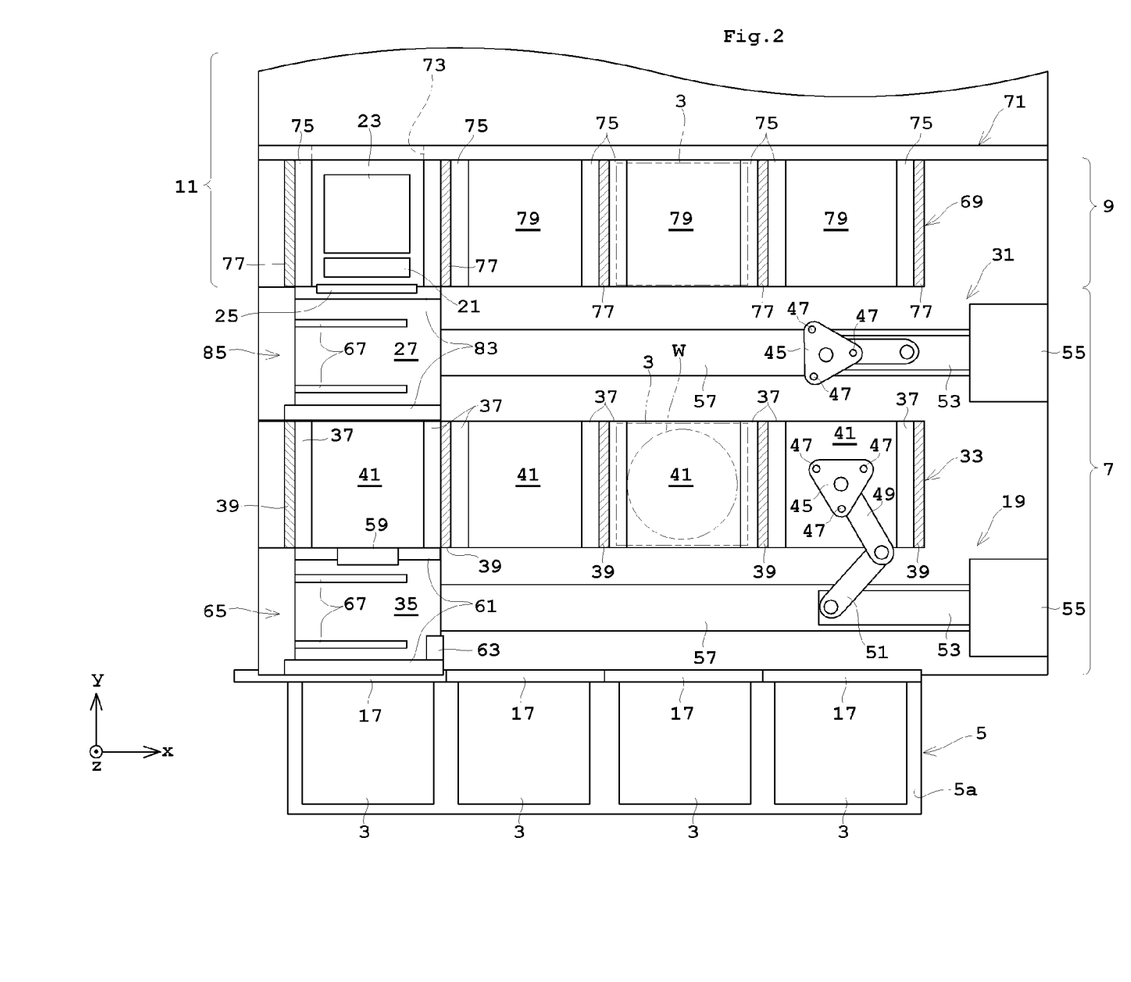
FIG. 2 is a plan view of a pod storage and transport unit and a pod storage unit.
Figure 3:
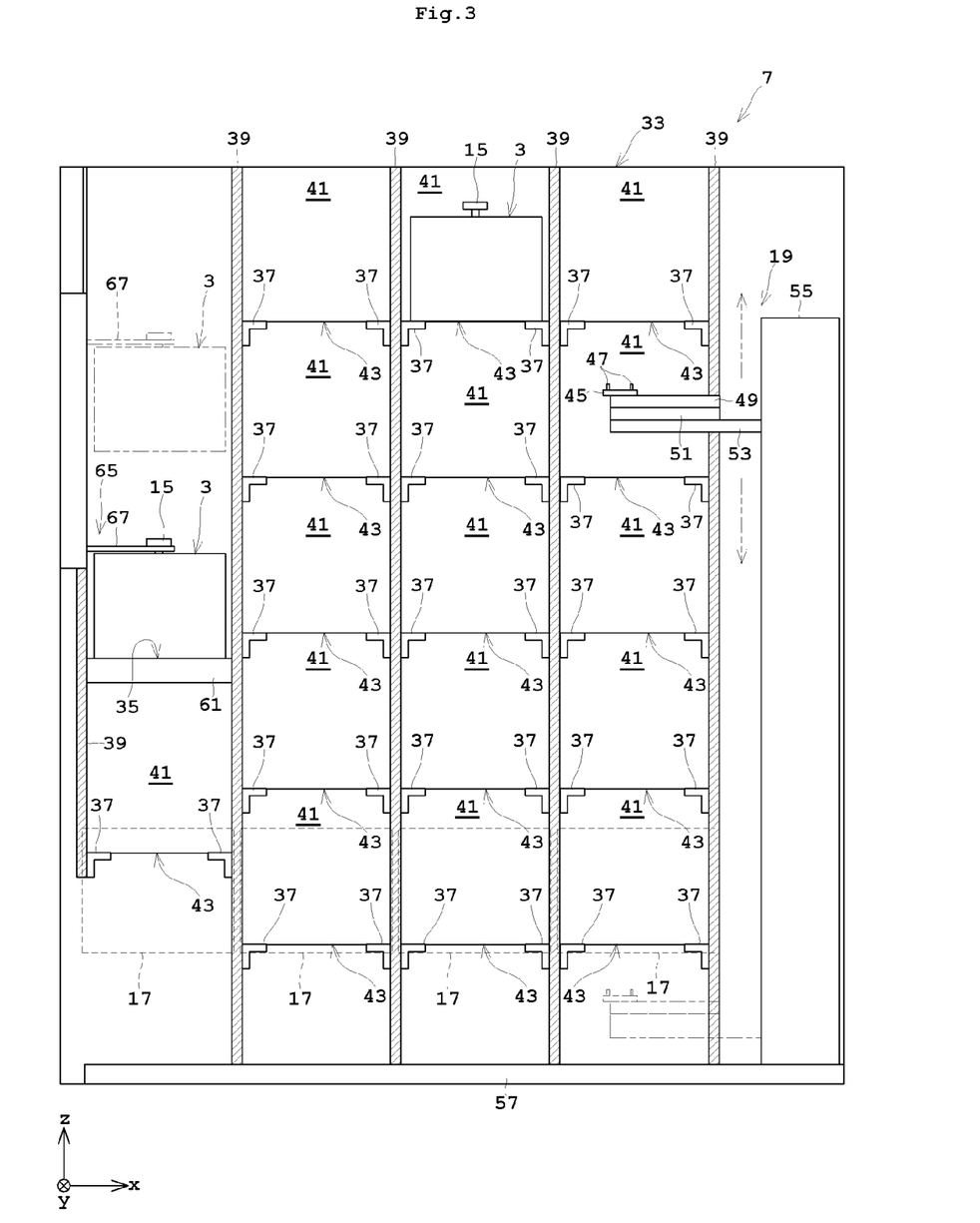
FIG. 3 is a front view of the pod storage and transport unit.

FIG. 1 is a perspective view showing an outward appearance of a substrate treating apparatus according to this invention. FIG. 2 is a plan view of a pod storage and transport unit and a pod storage unit. FIG. 3 is a front view of the pod storage and transport unit.

A substrate treating apparatus 1 according to this embodiment receives a plurality of wafers W contained in each FOUP (Front Opening Unified Pod) 3, along with the FOUP 3, takes the wafers W out of the FOUP 3, successively carries out treatments of the wafers W with treating liquids or solutions, and then deposits the wafers W in the FOUP 3 for delivery. The treatments with the treating liquids include, for example, etching treatment with hydrofluoric acid, rinsing treatment with deionized water, and film removal with a mixed liquid of sulfuric acid and hydrogen peroxide solution.

The substrate treating apparatus 1 includes, as main components thereof, a load port 5, a pod storage and transport unit 7, a pod storage unit 9 and a substrate treating unit 11. Further, a controller 13 is provided for performing overall control of the substrate treating apparatus 1. The controller 13 has, built therein, a CPU and memory not shown. In order to clarify directional relations, each figure shows an xyz orthogonal coordinate system with z-direction representing the vertical direction and xy plane representing a horizontal plane as necessary.

As shown in FIG. 3, each FOUP 3 has a flange 15 formed on an upper surface of a housing. Holes (not shown) are formed in the bottom of the housing. A transport system to be described hereinafter transports each FOUP 3 by gripping the flange 15 or engaging projections of an arm in the holes in the bottom. Each FOUP 3 has a lid (not shown) attachable to and detachable from an opening of the housing. Since the inside of FOUP 3 becomes a sealed space when the lid is attached, the inside of FOUP 3 where the wafers W are contained can be maintained at a high degree of cleanliness regardless of the degree of cleanliness of a clean room where the substrate treating apparatus 1 is installed. Each FOUP 3 can contain 25 wafers W in a horizontal position, for example.

The load port 5 receives FOUPs 3 transferred thereto by automatic guided vehicles which constitutes an automated material handling system, an overhead hoist transfer, or the operator of the substrate treating apparatus 1. The load port 5 is juxtaposed to the pod storage and transport unit 7, and a plurality of (four in this embodiment) FOUPs 3 are placed on a support surface 5a thereof.

The above load port 5 corresponds to the "first receiver" in this invention.

As shown in FIGS. 1 and 3, the pod storage and transport unit 7 has a plurality of (four in this embodiment) shutters 17 arranged on a side surface thereof adjacent the load port 5. When the shutters 17 are opened, openings are formed for communication between the exterior of the substrate treating apparatus 1 and the interior of the pod storage and transport unit 7.

With such construction, a transport robot 19 can transport a FOUP 3, through the opening is formed where the shutter 17 is opened, between the support surface 5a of the load port 5 and the inside space of the pod storage and transport unit 7. That is, a FOUP 3 containing wafers W to be treated is loaded from the load port 5 into the pod storage and transport unit 7. A FOUP 3 containing wafers W treated by the substrate treating unit 11 is delivered from the pod storage and transport unit 7 to the load port 5.

The pod storage and transport unit 7 temporarily stores therein FOUPs 3 placed on the load port 5, and transports the FOUPs 3 containing wafers W to the substrate treating unit 11.

The substrate treating unit 11 has an opening and closing mechanism 21 and a transport mechanism 23 disposed adjacent the pod storage and transport unit 7, which are used to transfer wafers W to and from the pod storage and transport unit 7 and pod storage unit 9. These opening and closing mechanism 21 and transport mechanism 23 are arranged next to a shutter 25 of the pod storage and transport unit 7.

The opening and closing mechanism 21 holds the lid of FOUP 3 to detach it from the FOUP 3 and attach it to the FOUP 3. The pod storage and transport unit 7 includes a receiver 27 disposed adjacent the shutter 25. When the shutter 25 is opened and the lid is detached from a FOUP 3 placed on the receiver 27, the transport mechanism 23 transports wafers W to and from this FOUP 3.

The above receiver 27 corresponds to the "second receiver" in this invention.

The wafers W loaded into the substrate treating unit 11 by the transport mechanism 23 receive various types of treatment by the substrate treating unit 11. Subsequently, the wafers W having undergone the treatment are transported by the transport mechanism 23 through the shutter 25 to the pod storage and transport unit 7 to be contained in the FOUP 3. As shown in FIG. 2, the pod storage and transport unit 7 mainly includes two transport robots 19 and 31, a rack array 33 and two receivers 27 and 35.

The components of the pod storage and transport unit 7 are arranged in three rows each extending along a horizontal direction (substantially in x-direction). That is, the transport robot 19 and receiver 35 are arranged in the first row as seen from the load port 5. The rack array 33 forms the second row from the load port 5. Further, the transport robot 31 and receiver 27 are arranged in the third row from the load port 5.

The rack array 33 is a storage portion for storing a plurality of (16 in this embodiment) FOUPs 3. That is, the rack array 33 stores FOUPs 3 containing wafers W to be treated, for example. As shown in FIGS. 2 and 3, the rack array 33 includes a plurality of racks arranged in two dimensions along the vertical direction (z-direction) and horizontal direction (x-direction).

Each of the racks has a pair of rack members 37. As shown in FIGS. 2 and 3, each rack member 37 assumes a substantially L-shaped vertical section. Each rack member 37 is attached to a frame 39 so that its longitudinal direction may be substantially parallel to y-direction. Although not shown, each rack member 37 has, formed on an upper surface thereof, projections corresponding to the holes formed in the bottom of each FOUP 3. Therefore, the pair of rack members 37 can stably hold the FOUP 3.

Thus, a pair of rack members 37 are used as a storage rack for storing a FOUP 3. An area between the pair of rack members 37 is used as storage space 41 for storing the FOUP 3.

The above rack array 33 corresponds to the "plurality of second racks" in this invention.

A pair of rack members 37 constituting a storage rack have an opening 43 formed therebetween. This opening 43 is larger than a forward end element 45 of the transport robot 19. As shown in FIG. 2, the openings 43 are arranged along the vertical direction (z-direction). Therefore, the forward end element 45 of the transport robot 19 can move up and down the interior of the rack array 33 while passing through these openings 43. That is, the respective openings 43 of the storage racks included in the rack array 33 enable passage of the forward end element 45 in the vertical direction.

As shown in FIG. 2, as seen from the rack array 33, the transport robot 19 is disposed adjacent the load port 5 while the transport robot 31 is disposed adjacent the substrate treating unit 11. In other words, the transport robot 19 is disposed opposite the transport robot 31 across the rack array 33.

The transport robot 31 has substantially the same construction as the transport robot 19. Therefore, only the construction of the transport robot 19 will be described in detail hereinafter.

The forward end element 45 of the transport robot 19 assumes a substantially triangular shape in plan view, and holds a FOUP 3 by its bottom. The forward end element 45 has projections 47 formed on an upper surface thereof adjacent the vertexes. Each FOUP 3 has three holes (not shown) formed in the bottom thereof and corresponding to these projections 47. The forward end element 45 is attached to a distal end of an arm 49 to be rotatable about a z-axis. Therefore, the transport robot 19 can stably hold a FOUP 3 by inserting the projections 47 into the holes of the FOUP 3 while rotating the forward end element 45 about the z-axis.

Further, the arm 49 has a proximal end thereof attached to a distal end of an arm 51. The arm 49 has the distal end thereof rotatable about a z-axis. The arm 51 has a proximal end thereof attached to a fixed base 53. The arm 51 has the distal end thereof rotatable about a z-axis. The fixed base 53 is vertically movably attached to a strut 55 erected in z-direction. Further, the strut 55 is constructed movable along a guide rail 57 extending horizontally (in x-direction).

Thus, the transport robot 19 moves the FOUP 3 held by the forward end element 45 horizontally (in x-direction) along the rack array 33, and up and down in the vertical direction (z-direction). Therefore, the transport robot 19 can transport the FOUP 3 between a storage space 41 of the rack array 33, the load port 5 and the receiver 35. The transport robot 31 transports a FOUP 3 between a storage space 79 of a rack array 69 of the pod storage unit 9, which will be described in detail hereinafter, a storage space 41 of the rack array 33 of the pod storage and transport unit 7, and the receiver 27.

The above transport robot 19 corresponds to the "first transport device" in this invention. The transport robot 31 corresponds to the "second transport device" in this invention.

The receiver 35 is used to carry out a mapping process. The mapping process refers to a process for checking the number and positions of wafers W contained in each FOUP 3 taken in from the load port 5. The receiver 35, as seen from the rack array 33, is disposed adjacent the load port 5. The receiver 35 has an opening and closing mechanism 59 for opening and closing the lids of FOUPs 3. As do the rack members 37, a pair of rack members 61 assume a substantially L-shaped vertical section, and have projections. The rack members 61 are attached to have a longitudinal direction thereof substantially parallel to x-direction. Further, the receiver 35 includes a counting mechanism 63 for counting the number of wafers W contained inside.

Thus, when a FOUP 3 is placed on the pair of rack members 61, the opening and closing mechanism 59 will detach the lid from the FOUP 3. Then, the counting mechanism 63 counts the number of wafers W contained in the FOUP 3. Subsequently, the opening and closing mechanism 59 attaches the lid to the FOUP 3.

The receiver 35 has a lifter 65 disposed above the rack members 61. The lifter 65 has lifter arms 67. The lifter arms 67 can move up and down in the vertical direction (z-direction) between a "deposit position" shown in solid lines in FIG. 3 and a "standby position" shown in two-dot chain lines. The lifter arms 67 grip the flange 15 of FOUP 3 and release the flange 15. Consequently, with the lifter arms 67 gripping the flange 15 of FOUP 3, the receiver 35 can raise the FOUP 3 having undergone the mapping process to the standby position.

Thus, the transport robot 19, immediately after placing a FOUP 3 to undergo the mapping process on the receiver 35, can receive from the receiver 35 a FOUP 3 having undergone the mapping process and having been raised to the standby position. That is, by the transport robot 19 making only one round trip between the rack array 33 and receiver 35, a FOUP 3 having undergone the mapping process can be replaced with a FOUP 3 yet to undergo the mapping process. As a result, the throughput of the pod storage and transport unit 7 can be further improved.

Figure 4:
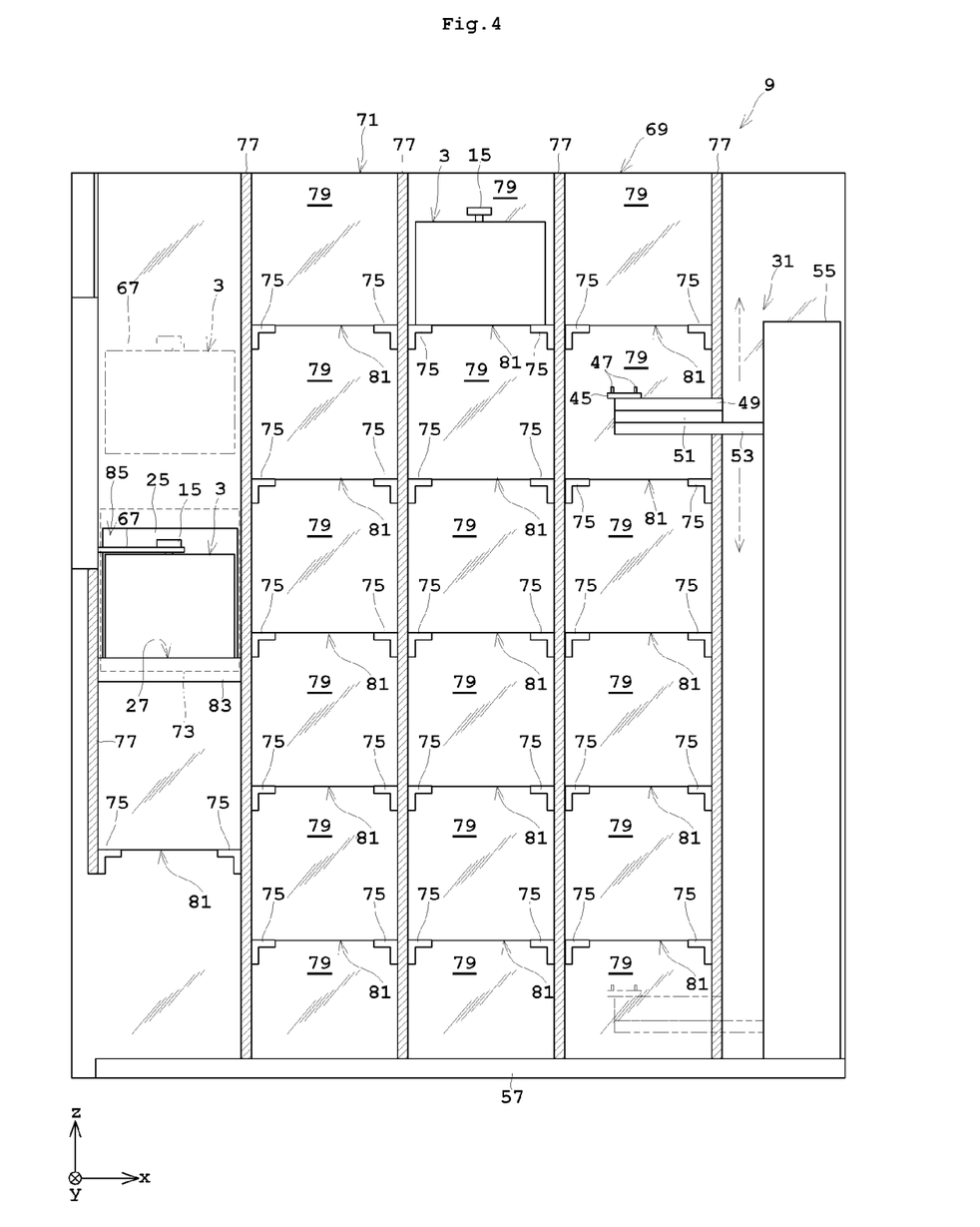
FIG. 4 is a front view of the pod storage unit.

Reference is now made to FIG. 4. FIG. 4 is a front view of the pod storage unit. It should be noted that, in order to facilitate understanding of the positional relationship, FIG. 4 depicts also part of the pod storage and transport unit 7.

The pod storage unit 9 is provided between the substrate treating unit 11 and pod storage and transport unit 7. That is, the pod storage unit 9 is juxtaposed to the substrate treating unit 11. This pod storage unit 9 has a rack array 69 having the same construction as the rack array 33 of the pod storage and transport unit 7. A partition 71 is formed adjacent the substrate treating unit 11 for separating the atmosphere of the substrate treating unit 11 from that of the pod storage unit 9 and pod storage and transport unit 7. The partition 71 has an opening 73 formed therein where the opening and closing mechanism 21 and transport mechanism 23 of the substrate treating unit 11 are arranged.

The rack array 69 has the same construction as the rack array 33 of the pod storage and transport unit 7 described hereinbefore. That is, the rack array 69 is a storage portion for storing a plurality of (16 in this embodiment) FOUPs 3. As shown in FIGS. 2 and 4, the rack array 69 includes a plurality of racks arranged in two dimensions along the vertical direction (z-direction) and horizontal direction (x-direction).

The above rack array 69 corresponds to the "plurality of first racks" in this invention.

Each of the racks has a pair of rack members 75, and each rack member 75 assumes a substantially L-shaped vertical section. Each rack member 75 is attached to a frame 77, and has, formed on an upper surface thereof, projections (not shown) for engaging each FOUP 3. Thus, the pair of rack members 37 can stably hold the FOUP 3. The area between the pair of rack members 75 is a storage space 79 for storing the FOUP 3.

The pair of rack members 75 has an opening 81 formed therebetween. The opening 81 is larger than forward end element 45 of the transport robot 31. Therefore, the forward end element 45 of the transport robot 31 can move up and down the interior of the rack array 36 while passing through these openings 81.

The receiver 27 is used to transfer wafers W contained in the FOUPs 3 to the substrate treating unit 11. The receiver 27 is disposed between the rack array 33 and rack array 69, and is disposed adjacent the substrate treating unit 11 as seen from the rack array 33.

A pair of rack members 83 forming the receiver 27 assume a substantially L-shaped vertical section, as do the pair of rack members 75, and have projections for engaging the bottom of each FOUP 3. As shown in FIGS. 2 and 4, the rack members 61 are attached to have a longitudinal direction thereof substantially parallel to x-direction.

The receiver 27 has a lifter 85 disposed above the rack members 83. As does the lifter 65 of the receiver 35 described hereinbefore, the lifter 85 has lifter arms 67. The lifter arms 67 can move up and down in the vertical direction (z-direction) between a "deposit position" shown in solid lines in FIG. 4 and a "standby position" shown in two-dot chain lines. The lifter arms 67 grip the flange 15 of FOUP 3 and release the flange 15. Consequently, with the lifter arms 67 gripping the flange 15 of FOUP 3, the receiver 27 can raise to the standby position the FOUP 3 empty of the wafers W which have been fed into the substrate treating unit 11.

Consequently, the transport robot 31, immediately after placing a FOUP 3 containing wafers W to be treated on the receiver 27, can receive from the receiver 27 the empty FOUP 3 having been raised to the standby position. That is, the empty FOUP 3 can be replaced with a FOUP 3 containing wafers W to be treated, by the transport robot 31 only fetching a FOUP 3 having undergone the mapping process from the side of the rack array 33 opposed to the substrate treating unit 11, placing this FOUP 3 on the receiver 27, receiving the empty FOUP 3 from the standby position, and transporting the empty FOUP 3 to the rack array 69.

In the substrate treating apparatus 1, the controller 13 controls transportation of the FOUPs 3 as follows, for treatment of the wafers W.

<Basic Setting>

The controller 13 makes priority use of the rack array 33 of the pod storage and transport unit 7 for storing FOUPs 3 containing wafers W waiting to be treated and FOUPs 3 containing treated wafers W and waiting to be delivered. Further, the controller 13 makes priority use of the rack array 69 of the pod storage unit 9 for storing empty FOUPs 3 having contained wafers W which are under treatment in the substrate treating unit 11. However, because the substrate treating unit 11 is higher in throughput than the automated material handling system, for example, there could arise a situation where the FOUPs 3 containing treated wafers W and waiting to be delivered exceed the capacity of the rack array 33 of the pod storage and transport unit 7. In such a case, the FOUPs 3 containing treated wafers W and waiting to be delivered may be stored also in the rack array 69 of the pod storage unit 9.

The apparatus in this embodiment has the construction described above, which includes the pod storage unit 9 between the substrate treating unit 11 and pod storage and transport unit 7, with the transport robot 19 transporting the FOUPs 3 between the load port 5 and rack array 33. The transport robot 31 transports the FOUPs 3 between the rack array 33, rack array 69 and receiver 27. Therefore, the transportation between the load port 5 and rack array 33 and the transportation between the rack array 69, rack array 33 and receiver 27 can be carried out substantially in parallel. As a result, the efficiency of transporting the FOUPs 3 can be improved to improve throughput. Moreover, an increase in apparatus size can be inhibited since only the pod storage unit 9 is disposed between the pod storage and transport unit 7 and substrate treating unit 11. Therefore, while inhibiting an increase in apparatus size, the capacity for storing the FOUPs 3 can be increased to make effective use of the high throughput of the apparatus.

Empty FOUPs 3 are stored with priority in the rack array 69 close to the receiver 27, and therefore treated wafers W can be placed in the FOUPs 3 in a short time. Further, the FOUPs 3 containing the treated wafers W are stored with priority in the rack array 69 close to the receiver 35. This allows the FOUPs 3 containing the treated wafers W to be transported to the load port 5 in a short time.

<Vacancy Setting 1>

The controller 13 preferably controls transportation to leave vacant at least one of the storage spaces 41 of the rack array 33 of the pod storage and transport unit 7. For the reason noted above, for example, in a state of storing a FOUP 3 containing treated wafers W in the rack array 69 of the pod storage unit 9, there may arise a necessity to deliver this FOUP 3 before the FOUPs 3 containing treated wafers W and stored in the rack array 33 of the pod storage and transport unit 7. In such a case, the FOUP 3 in question can be delivered with priority to the load port 5 through the one storage space 41 left vacant in the rack array 33 of the pod storage and transport unit 7.

The storage space 41 left vacant as described above need not be a particular storage space 41 in the rack array 33, but may be any one of the storage spaces 41 according to an accommodating situation. In other words, the controller 13 performs dynamic control to leave at least one of the storage spaces 41 vacant. When only one available storage space 41 of the rack array 33 remains in the course of such control, even if a new FOUP 3 has been transported to the load port 5, the new FOUP 3 is not admitted to the rack array 33 of the pod storage and transport unit 7, but is kept on standby on the load port 5.

<Vacancy Setting 2>

The controller 13 preferably controls transportation to leave vacant at least one of the storage spaces 79 of the rack array 69 of the pod storage unit 9. When treated wafers W are unloaded from the substrate treating unit 11 in a state of the rack array 33 of the pod storage and transport unit 7 being full up, for example, the vacant storage space 79 can be used temporarily to accommodate the FOUP 3 having contained these wafers W before the treatment. This can prevent stagnation in unloading treated wafers W from the substrate treating unit 11.

<Provisional Receiving Rack Setting>

The controller 13 preferably sets a storage space 41 of the rack arrays 33 as a provisional receiving rack. The provisional receiving rack here refers to a storage space 41 to be used only for one-way transportation from the transport robot 31 to the transport robot 19. For example, a storage space 41 located below the receiver 35 of the rack array 33 is set as the provisional receiving rack. The controller 13 restricts the transportation to use of the provisional receiving rack only for delivery from the rack array 69 to the load port 5. By setting such provisional receiving rack, FOUPs 3 can always be delivered with priority from the rack array 69 to the load port 5.

<Multiple Transportation>

When there is a vacancy in the rack array 69 of the pod storage unit 9 or the rack array 33 of the pod storage and transport unit 7, the controller 13 preferably requires the automated material handling system to transport more FOUPs 3 than the number of FOUPs 3 that can be placed on the load port 5.

The automated material handling system transports one FOUP 3 at a time, and thus, for example, after one FOUP 3 is placed on the load port 5, a next FOUP 3 is transported. This is a common mode of transportation by the automated material handling system. However, when two transport vehicles continually transport new FOUPs 3 to the load port 5, the transporting intervals of the automated material handling system may be set twice as long. This can lighten the load on the automated material handling system. It is also possible to transport more FOUPs 3 than the number of FOUPs 3 placeable on the load port 5. This is made possible by drastically increasing the number of FOUPs 3 that can be stored in the substrate treating apparatus 1 over the prior art.

This invention is not limited to the foregoing embodiment, but may be modified as follows:

(1) In the foregoing embodiment, each of the rack arrays 33 and 69 of the pod storage and transport unit 7 and pod storage unit 11 has 16 storage spaces 41 or 79. The invention is not limited to such construction. The number of storage spaces 41 or 79 may be less than 16 or more than 16.

(2) In the foregoing embodiment, each of the transport robots 19 and 31 has the construction including the forward end element 45 and arms 49 and 51. However, the transport robot 19 is not limited to such construction, as long as it can transport FOUPs 3 between the load port 5 and rack array 33. Similarly, the transport robot 31 is not limited to such construction, as long as it can transport FOUPs 3 between the rack array 33, rack array 69 and receiver 27.

(3) In the foregoing embodiment, a vacancy is set to the rack array 33 as described in <Vacancy setting 1>. Instead, all the storage spaces 41 of the rack array 33 may store FOUPs 3. Similarly, instead of setting a vacancy to the rack array 69 as described in <Vacancy setting 2>, all the storage spaces 79 of the rack array 69 may store FOUPs 3.

(4) In the foregoing embodiment, a setting is made as in the <Basic setting> to make priority use of the rack array 33 of the pod storage and transport unit 7 for storing FOUPs 3 containing wafers W waiting to be treated and FOUPs 3 containing treated wafers W and waiting to be delivered. However, this invention is not limited to such setting, but an appropriate setting may be made according to a situation of transporting FOUPs 3, for example.

This invention may be embodied in other specific forms without departing from the spirit or essential attributes thereof and, accordingly, reference should be made to the appended claims, rather than to the foregoing specification, as indicating the scope of the invention.

What is claimed is:

1. A substrate treating apparatus comprising:
a substrate treating unit for treating substrates;
a pod storage unit disposed adjacent the substrate treating unit for storing pods which are configured for containing the substrates;
a pod storage and transport unit disposed adjacent the pod storage unit for storing and transporting the pods; and
a first receiver disposed adjacent the pod storage and transport unit for receiving pods loaded from outside the substrate treating apparatus and containing the substrates to be treated, and for unloading pods to outside the substrate treating apparatus;
wherein the pod storage unit includes a plurality of first racks for holding the pods; and
the pod storage and transport unit includes:
a plurality of second racks for holding the pods;

a second receiver disposed between the substrate treating unit and the second racks for receiving the pods, and for fetching and depositing the substrates from/into the pods;

a first transport device for transporting the pods between the first receiver and the second racks; and a second transport device for transporting the pods between the first racks, the second racks and the second receiver, wherein the second transport device is arranged to transport an empty pod to one of the first racks after the substrates are taken out of the pod on the second receiver and transported to the substrate treating unit.

2. The substrate treating apparatus according to claim 1 further comprising:

a controller for controlling transportation by the first transport device and the second transport device;

wherein the controller is arranged to control transportation of the pods to secure a vacancy among the second racks for storing at least one pod.

3. The substrate treating apparatus according to claim 1 further comprising:

a controller for controlling transportation by the first transport device and the second transport device;

wherein the controller is arranged to control transportation of the pods to secure a vacancy among the first racks for storing at least one pod.

4. The substrate treating apparatus according to claim 1 further comprising:

a controller for controlling transportation by the first transport device and the second transport device;

wherein the pod storage and transport unit includes a provisional receiving rack for allowing transportation of the pods only in one way from the first transport device to the second transport device; and the controller is arranged to make priority use of the provisional receiving rack for delivery of the pods.

5. The substrate treating apparatus according to claim 1 wherein the first racks hold, with priority, the pods having contained the substrates under treatment by the substrate treating unit.

6. The substrate treating apparatus according to claim 2 wherein the first racks hold, with priority, the pods having contained the substrates under treatment by the substrate treating unit.

7. The substrate treating apparatus according to claim 3 wherein the first racks hold, with priority, the pods having contained the substrates under treatment by the substrate treating unit.

8. The substrate treating apparatus according to claim 4 wherein the first racks hold, with priority, the pods having contained the substrates under treatment by the substrate treating unit.

9. The substrate treating apparatus according to claim 1 wherein the second racks hold, with priority, the pods containing the substrates before being loaded into the substrate treating unit, and the pods containing the substrates having been treated by the substrate treating unit.

10. The substrate treating apparatus according to claim 2 wherein the second racks hold, with priority, the pods containing the substrates before being loaded into the substrate treating unit, and the pods containing the substrates having been treated by the substrate treating unit.

11. The substrate treating apparatus according to claim 3 wherein the second racks hold, with priority, the pods containing the substrates before being loaded into the substrate treating unit, and the pods containing the substrates having been treated by the substrate treating unit.

12. The substrate treating apparatus according to claim 4 wherein the second racks hold, with priority, the pods containing the substrates before being loaded into the substrate treating unit, and the pods containing the substrates having been treated by the substrate treating unit.

13. The substrate treating apparatus according to claim 5 wherein the second racks hold, with priority, the pods containing the substrates before being loaded into the substrate treating unit, and the pods containing the substrates having been treated by the substrate treating unit.

14. The substrate treating apparatus according to claim 4 wherein the provisional receiving rack is a second rack among the second racks which adjoins the second receiver.

15. The substrate treating apparatus according to claim 8 wherein the provisional receiving rack is a second rack among the second racks which adjoins the second receiver.

16. The substrate treating apparatus according to claim 12 wherein the provisional receiving rack is a second rack among the second racks which adjoins the second receiver.

17. The substrate treating apparatus according to claim 1 wherein:

the first racks are arrayed horizontally and vertically along the substrate treating unit;

the second transport device is movable horizontally and vertically along the first rack in the array; and the second racks are arrayed horizontally and vertically along the second transport device.

18. The substrate treating apparatus according to claim 17 wherein the second transport device is arranged to transport an empty pod to one of the first racks after the substrates are taken out of the pod on the second receiver and transported to the substrate treating unit.

* * * * *